United States Patent [19]
Hung et al.

[11] Patent Number: 5,776,622
[45] Date of Patent: Jul. 7, 1998

[54] BILAYER ELETRON-INJETING ELECTRODE FOR USE IN AN ELECTROLUMINESCENT DEVICE

[75] Inventors: Liang-Sun Hung, Webster; Ching W. Tang, Rochester, both of N.Y.

[73] Assignee: Eastman Kodak Company, Rochester, N.Y.

[21] Appl. No.: 681,680

[22] Filed: Jul. 29, 1996

[51] Int. Cl.$^6$ ............... H05B 33/04; B32B 15/04
[52] U.S. Cl. ............... 428/690; 313/502; 313/503; 313/504; 313/505; 313/506; 428/457; 428/209; 428/691; 428/917
[58] Field of Search ............... 31/502, 503, 504, 31/505, 506; 428/457, 690, 691, 917, 209

[56] References Cited

U.S. PATENT DOCUMENTS

| | | | |
|---|---|---|---|
| 4,885,211 | 12/1989 | Tang et al. | 428/457 |
| 5,409,783 | 4/1995 | Tang et al. | 428/690 |
| 5,652,067 | 7/1997 | Ito et al. | 428/690 |

*Primary Examiner*—John M. Cooney, Jr.
*Attorney, Agent, or Firm*—Raymond L. Owens

[57] ABSTRACT

An electroluminescent device comprising an anode, an electroluminescent layer, and a cathode. The cathode includes a fluoride layer contacting the electroluminescent layer, a conductive layer contacting the fluoride layer, and the thickness of the fluoride layer being selected so that the bilayer acts as an electron injecting contact, the bilayer providing stability against atmospheric corrosion.

22 Claims, 2 Drawing Sheets

BILAYER ELETRON-INJETING ELECTRODE FOR USE IN AN ELECTROLUMINESCENT DEVICE

CROSS REFERENCE TO RELATED APPLICATIONS

Reference is made to commonly assigned U.S. Ser. No. 08/681,734 filed concurrently and entitled "Transparent Electron Injecting-Electrode for Use in an Electroluminescent Device" to Hung et al, and commonly-assigned U.S. Ser. No. 08/681,565, filed concurrently and entitled "Bilayer Electrode on a N-type Semiconductor" by Hung et al, which is now U.S. Pat. No. 5,677,572, the disclosures of which are incorporated by reference.

FIELD OF THE INVENTION

The present invention relates to bilayer electron-injecting electrodes which are particularly effective for use with organic LED devices used in electroluminescent structures.

BACKGROUND OF THE INVENTION

There is considerable interest in the use of organic materials for the fabrication of light-emitting diodes (LED) or electroluminescent (EL) device. To achieve the best device performance, it is desirable to use metals having a low work function for electron injection into organic materials. However, metals with a low work function are always susceptible to atmospheric oxidation. For instance, Mg has a work function of 3.7 eV and is a good candidate for the electron injector. Its alloys, such as MgAg, are commonly used in organic EL devices, but they have poor corrosion resistance. A bilayer cathode has been used with a thin lithium-aluminum layer next to an electron transporting organic layer and an aluminum outlayer. However, it is well known that lithium is also unstable as it readily reacts with moisture to form lithium hydroxide and with carbon dioxide to form lithium carbonate.

For display applications, it is desirable to produce an active addressing display panel where an array of organic devices is incorporated on a semiconductor substrate containing driver electronics and pixel switching elements. When a semiconductor wafer such as Si is used as a substrate, the light emission through the substrate is blocked because of the substrate is opaque. Therefore, the organic EL panel fabricated on these substrates needs to be surface-emitting, i.e. the emission is directed away from the substrate. This configuration requires the top electrode of the EL device to be light transmissive and the bottom electrode to be compatible with the substrate. Common light transmissive electrodes are indium-tin oxide (ITO) and thin metal layers of Au. With these high-work function materials on the top as a hole injector, metals with a low work function are required to form an electron-injecting bottom electrode. However, adjacent to the semiconductor substrate, the low-work-function metals are either highly reactive with Si or may act as a fast diffusing species, thus potentially affecting the device performance. Novel materials, other than low-work-function metals, are therefore needed to produce a stable electron-injecting electrode compatible with the Si substrate.

SUMMARY OF THE INVENTION

It is an object of the present invention to provide an effective electron-injecting electrode for an electroluminescent device.

This object is achieved in an electroluminescent device comprising an anode, an electroluminescent layer, and a cathode, said cathode comprises a bilayer structure, comprising:

a) a fluoride layer contacting the electroluminescent layer;

b) a conductive layer contacting the fluoride layer; and c) the thickness of the fluoride layer being selected so that the bilayer acts as an electron injecting contact, the bilayer providing stability against atmospheric corrosion.

Specifically, when the invention is embodied in an organic electroluminescent device, the device has a transmissive and conductive hole-injecting anode, an organic EL layer, and an electron-injecting electrode in contact with the organic EL layer, the electron-injecting electrode comprising:

a) a fluoride layer contacting the organic electroluminescent layer;

b) a conductive layer contacting the fluoride layer; and c) the thickness of the fluoride layer being selected so that the bilayer acts as an electron injecting electrode, the bilayer providing stability against atmospheric corrosion.

ADVANTAGES

Both coevaporation of Mg and Ag and sequential deposition of lithium oxides and aluminum have been used to form the cathode reference. MgAg is sensitive to oxidation and shows poor corrosion resistance due to galvanic interactions. Lithium readily react with moisture or carbon dioxide to form lithium hydroxides or carbonates. In contrast, alkali and alkaline earth metal fluorides are quite stable, and the reaction with most of the materials is thermodynamically inhibited.

Lithium fluoride is a superior insulating material because it has the highest bandgap energy of 12 eV among oxides and fluorides. It is disclosed in this invention, however, that lithium fluoride in the form of ultra thin film (tens of angstroms) backed by a suitable metal layer is an effective electron injector. Light emitting diodes with the disclosed cathode show low operating voltage and high device efficiency at low current densities.

DETAILED DESCRIPTION OF THE INVENTION

Figure 1:
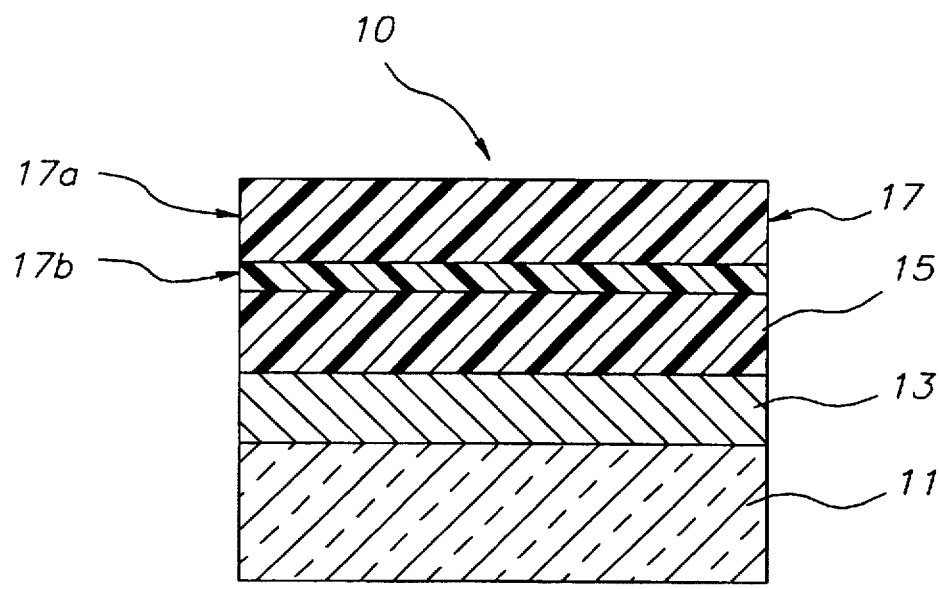
FIG. 1 is a schematic diagram of an embodiment of the electroluminescence device of the invention.

Referring to FIG. 1, an EL device 10 of the invention has, in order, a substrate 11, a hole-injecting electrode 13, an organic layer structure 15, an electron-injecting electrode 17. The top electrode includes a fluoride layer 17a and a conductive overlayer 17b.

Substrate 11 is a glass substrate. It is either bare or covered with a layer of polycrystalline silicon. In some applications, part of the substrate can be used as substrate 11 for EL device 10, while the remainder of the polycrystalline silicon-coated wafer can be processed to form drivers, switchers, or other electronic devices.

Hole-injecting electrode layer 13 injects holes into the organic EL layer when this electrode is positively biased. It is either a conducting oxide or a thin metal layer with sufficient optical transparency to allow light to traverse through this layer and the substrate. Suitable metal oxides include indium-tin-oxide, aluminum- or indium-doped zinc oxide, tin oxide, magnesium-indium-oxide, and cadmium-tin-oxide. Suitable metals include gold, silver, nickel, palladium, and platinum. The desired metal oxides and metals can be deposited by evaporation, sputtering, laser ablation, and chemical vapor deposition. A thickness ranging from 50 to 1000 nm for the metal oxide layer is useful as the hole injector, preferably 100–500 nm; and a thickness ranging from 5–50 nm for the metal layer, preferable 10–30 nm.

Organic layer structure 15 either has a single layer acting as a light emitter or a multilayer structure, including a light emitter and carrier-confinement layers. For instance, a useful structure includes a diamine layer and an undoped or doped Alq layer. Other suitable materials used for light emitters include conjugated polymers such as poly(paraphenylene vinylene) (PPV); PPV copolymers; derivatives; poly(3-alkylthiophene); poly(3-octylthiophene); and poly(paraphenylene); fluorescent dyes or pigments such as those disclosed in U.S. Pat. Nos. 5,294,869 and 5,151,629 referenced herein, or a mixture of fluorescent dyes and pigments in a polymeric binder. Organic layer structure 15 can be prepared by thermal evaporation or spin-coating from a solution.

Electron-injecting electrode 17 injects electrons into the organic EL layer when the electrode is negatively biased. It includes a thin fluoride layer 17a and a thick conductive overlayer 17b. Examples 1 and 2 described in this invention indicate that the fluoride can be selected from the group of alkali fluorides and alkaline earth fluorides. The conductive outlayer can be selected from the group of elemental metals, metal alloys, and other conductive materials.

Figure 2:
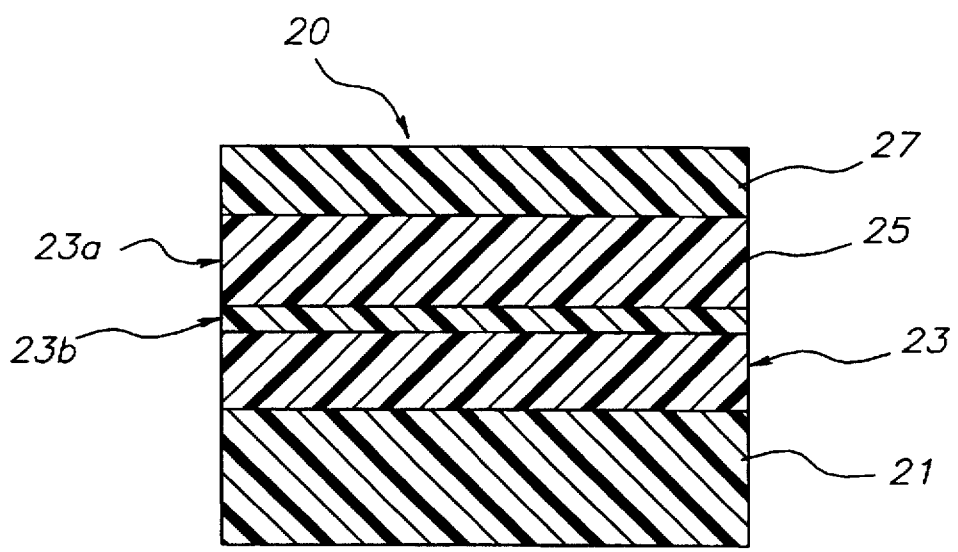
FIG. 2 is a schematic diagram of an alternative embodiment of the invention.

Referring to FIG. 2, an EL device 20 of the invention has, in order, a substrate 21, a electron-injecting electrode 23, an organic EL layer structure 25, a hole-injecting electrode 27. The electron-injecting electrode 23 includes a fluoride layer 23a and a conductive layer 23b.

Substrate 21 is a single crystal semiconductor substrate selected from the group consisting of Si, Ge, GaAs, GaP, GaN, GaSb, InAs, InP, InSb, or $Al_xGa_{1-x}As$, where x is from 0 to 1. Substrate 21 can be either undoped, lightly doped, or heavily doped. Substrate 21 is either bare or covered with a layer of dielectric material such as Si oxides or Si nitrides. In some applications, part of the semiconductor can be used as substrate 21 for electroluminescent device 20, while the remainder of the semiconductor wafer can be processed to form drivers, switchers, or other electronic devices.

Electron-injecting electrode 23 a good stability against atmospheric oxidation is compatible with substrate 21 showing no interactions with the substrate. The bilayer includes of a thin fluoride layer 23a and a thick conductive layer 23b. Examples 1 and 2 described in this invention indicate that the fluoride can be selected from the group of alkali fluorides and alkaline earth fluorides. The conductive layer can be selected from the group of elemental metals, metal alloys, and conductive materials.

In accordance with this invention, the thickness of the fluoride layer should be from 0.3 to 5.0 nm, preferably 0.5 to 1.0 nm. When the thickness is below 0.3 nm, the fluoride layer may not be continuous and therefore its electron injection efficiency into the organic EL layer may be reduced. When the thickness is above 5.0 nm, the applied current through the bilayer into the organic layer may be reduced. A useful range of the conductive layer thickness is from 10 to 1000 nm, preferably 50–500 nm. Electron-injecting electrode 23 can be deposited by many conventional means, such as evaporation, sputtering, laser ablation, and chemical vapor deposition.

Organic layer structure 25 either has a single layer acting as a light emitter or a multilayer structure, including a light emitter and carrier-confinement layers. The composition of this layer is similar to that described for organic layer 15 in FIG. 1.

Hole-injecting electrode layer 27 is either a transparent conducting oxide or a thin metal layer, thus allowing light emitting from the top surface. Suitable metal oxides include indium-tin-oxide, aluminum- or indium-doped zinc oxide, tin oxide, magnesium-indium-oxide, and cadmium-tin-oxide. The material should also have a high work function, i.e. greater than 4.2 eV, to provide efficient hole injection. Suitable metals include gold, silver, nickel, palladium, and platinum. When a thin metal layer is used as a hole injector, a transparent encapsulating layer may be needed to protect the thin metal and the organic EL layer from ambient moisture. The desired metal oxides and metals can be deposited by evaporation, sputtering, laser ablation, and chemical vapor deposition. A thickness ranging from 50 to 1000 nm for the metal oxide layer is useful, preferably 100–500 nm; and a thickness ranging from 5–50 nm for the metal layer, preferable 10–30 nm.

The following examples are presented for a further understanding of the invention.

EXAMPLE 1

An organic EL device satisfying the requirements of the invention was constructed in the following manner:

a) a transparent anode of indium tin oxide coated glass was ultrasonicated in a commercial detergent, rinsed in deionized water, degreased in toluene vapor, and contacted a strong oxidizing agent;

b) a 15 nm-thick CuPc layer was deposited on the anode;

c) a 60 nm-thick hole transporting NPB layer was deposited on the CuPc layer;

d) a 75 nm-thick electron transporting Alq layer was deposited on the NPB layer;

e) a 0.5 nm-thick lithium fluoride layer was deposited on the Alq layer; and f) a 120 nm-thick aluminum layer was deposited on the LiF layer. All materials were prepared by thermal evaporation from tantalum boats.

EXAMPLE 2

The same materials and processing procedures were employed as described in Example 1, except that the lithium fluoride layer was replaced by a magnesium fluoride layer or a calcium fluoride layer.

EXAMPLE 3

An organic EL device was constructed in the following manner:

a) a transparent anode of indium tin oxide coated glass was ultrasonicated in a commercial detergent, rinsed in deionized water, degreased in toluene vapor, and contacted a strong oxidizing agent;

b) a 15 nm-thick CuPc layer was deposited on the anode;

c) a 60 nm-thick hole transporting NPB layer was deposited on the CuPc layer;

d) a 75 nm-thick electron transporting Alq layer was deposited on the NPB layer; and e) a 120 nm- thick aluminum layer was deposited on the Alq layer. All materials were prepared by thermal evaporation from tantalum boats.

EXAMPLE 4

The same materials and processing procedures were employed as described in Example 3, except that the aluminum layer was replaced by a 200 nm thick MgAg layer with an atomic ratio of Mg:Ag=9:1.

Figure 3:
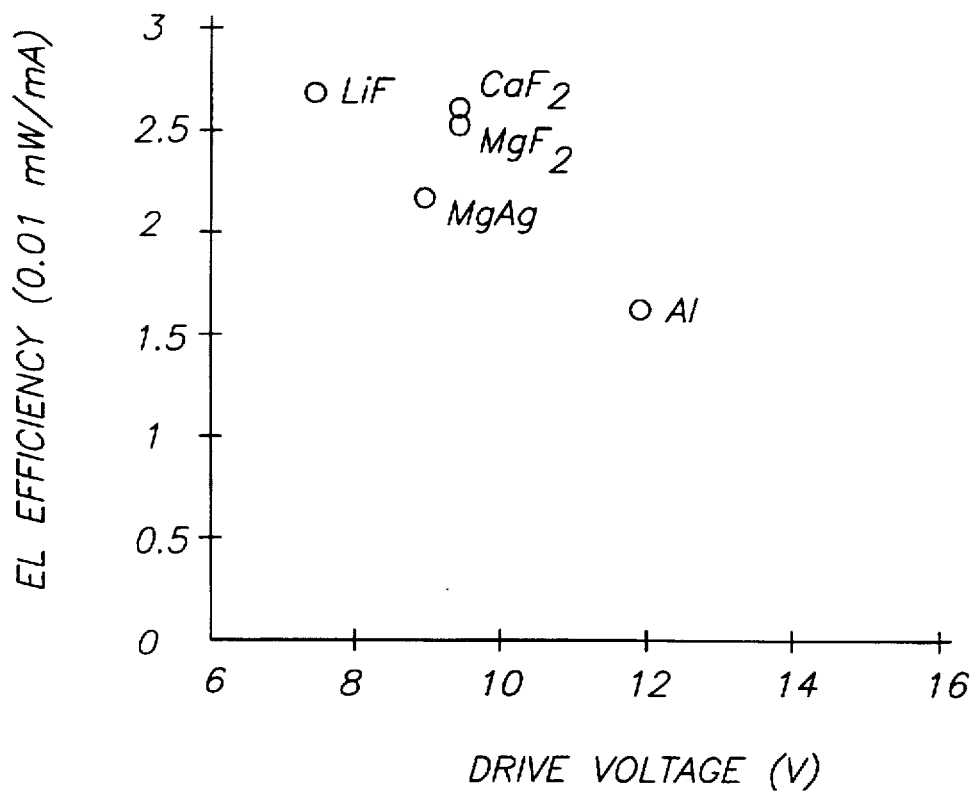
FIG. 3 shows device characteristics using the bilayer cathode.

All the devices were evaluated with a positive potential applied to the anode and the cathode attached to ground to determine the characteristics of voltage-current and current-light emission, and the results are summarized in FIG. 3. In the plot, the horizontal axis shows the drive voltage to generate a light output of 0.1 mW/cm$^2$, and the vertical axis shows the electroluminescence efficiency. The device with an aluminum cathode requires a drive voltage of approximately 12 V to generate a light output of 0.1 mW/cm$^2$, which is substantially higher than that of the device with a MgAg cathode. Occurring with the higher drive voltage is a lower EL efficiency. The difference is attributed to a higher work function of Al (4.3 eV) than that of Mg (3.7 eV). It is surprising, however, that the device performance with an Al cathode can be dramatically improved by interposing an one- to two- monolayer of LiF, MgF$_2$, or CaF$_2$ between Alq and Al. For instance, with a bilayer cathode (Al/LiF) the drive voltage is reduced to 7.4 V, and the EL efficiency is increased to 0.028 mW/cm$^2$. The results are much better than that with a MgAg cathode.

The invention has been described in detail with particular reference to certain preferred embodiments thereof, but it will be understood that variations and modifications can be effected within the spirit and scope of the invention.

| Parts List | |
| --- | --- |
| 10 | electroluminescence device |
| 11 | substrate |
| 13 | hole-injecting electrode layer |
| 15 | organic layer structure |
| 17 | electron-injecting electrode |
| 17a | fluoride layer |
| 17b | conductive overlayer |
| 20 | electroluminescence device |
| 21 | substrate |
| 23 | electron-injecting electrode |
| 23a | fluoride layer |
| 23b | conductive layer |
| 25 | organic layer structure |
| 27 | hole-injecting electrode layer |

We claim:

1. An electroluminescent device comprising an anode, an electroluminescent layer, and a cathode, said cathode comprises a bilayer structure, comprising:
   a) a fluoride layer contacting the electroluminescent layer;
   b) a conductive layer contacting the fluoride layer; and
   c) the thickness of the fluoride layer being selected so that the bilayer acts as an electron injecting contact, the bilayer providing stability against atmospheric corrosion.

2. The cathode of claim 1 wherein the thickness of the fluoride layer is in a range of 0.3 to 5.0 nm.

3. The cathode of claim 1 wherein said fluoride is selected from an alkali fluoride, or an alkaline earth fluoride.

4. The cathode of claim 1 wherein said conductive layer is elemental metal, metal alloy, or conductive materials.

5. The cathode of claim 3 wherein said alkali fluoride includes lithium fluoride, sodium fluoride, potassium fluoride, rubidium, robidium fluoride, or cesium fluoride.

6. The cathode of claim 3 wherein said alkaline earth fluoride includes magnesium fluoride, calcium fluoride, strontium fluoride, or barium fluoride.

7. The conductive cathode of claim 4 wherein said conductive materials include a conductive boride, carbide, nitride, or oxide.

8. In an electroluminescent device having, in sequence, a substrate, a transmissive and conductive hole-injecting anode, an organic electroluminescent layer, and a cathode in contact with the organic electroluminescent layer, the cathode layer comprising:
   a) a fluoride layer contacting the organic layer;
   b) a conductive overcoat layer over the fluoride layer; and
   c) the thickness of the fluoride layer being selected so that the bilayer acts as an electron injecting contact, the bilayer providing stability against atmospheric corrosion.

9. The device of claim 8 wherein the thickness of the fluoride layer is in a range of 0.3 to 5.0 nm.

10. The device of claim 8 wherein said cathode is encapsulated or uncapsulated.

11. An electroluminescent device comprising:
   a single crystal semiconductor substrate,
   a bilayer electrode including a conductive layer on the substrate and an overlying fluoride layer, the thickness of the fluoride layer being in a range of 0.3 to 5nm;
   an organic electroluminescent layer; and
   a hole-injecting transparent electrode having a work function with a value greater than 4.1 eV.

12. The device of claim 11 wherein said substrate is selected from the group consisting of Si, Ge, GaAs, GaP, GaN, GaSb, InAs, InP, InSb, or Al$_x$Ga$_{1-x}$As, where x is from 0 to 1.

13. The device of claim 11 wherein said fluoride is selected from an alkali fluoride, or an alkaline earth fluoride.

14. The device of claim 11 wherein said conductive overcoat layer is elemental metal, metal alloy, or conductive materials.

15. The device of claim 13 wherein said alkali fluoride includes lithium fluoride, sodium fluoride, potassium fluoride, rubidium, robidium fluoride, or cesium fluoride.

16. The device of claim 13 wherein said alkaline earth fluoride includes magnesium fluoride, calcium fluoride, strontium fluoride, or barium fluoride.

17. The device of claim 14 wherein said conductive materials include a conductive boride, carbide, nitride, or oxide.

18. The device of claim 11 wherein the organic electroluminescent layer is selected from the group of poly (paraphenylene vinylene) (PPV), PPV copolymer and derivatives, polyaniline, poly(3-alkylthiophene), poly(3-octylthiophene), poly(paraphenylene), or 8-hydroxyquinoline aluminum (Alq).

19. The device of claim 11 wherein said hole-injecting transparent electrode is a conducting oxide or a thin metal layer.

20. The device of claim 19 wherein said conducting oxides includes indium-tin-oxide, aluminum- or indium-doped zinc oxide, tin oxide, magnesium-indium-oxide, or cadmium-tin-oxide.

21. The device of claim 19 wherein said hole-injecting electrode is selected from the group consisting of noble and near-noble metals.

22. The device of claim 21 wherein said noble and near-noble metals include gold, silver, nickel, palladium, and platinum.

* * * * *